United States Patent
Suzuki et al.

(10) Patent No.: US 7,352,891 B2
(45) Date of Patent: Apr. 1, 2008

(54) POSITION DETECTING METHOD

(75) Inventors: Takehiko Suzuki, Saitama (JP); Satoru Oishi, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 666 days.

(21) Appl. No.: 10/871,464

(22) Filed: Jun. 18, 2004

(65) Prior Publication Data

US 2005/0025352 A1 Feb. 3, 2005

(30) Foreign Application Priority Data

Jun. 19, 2003 (JP) .............................. 2003-174263

(51) Int. Cl.
*G06K 9/00* (2006.01)

(52) U.S. Cl. ...................... 382/151; 382/145; 702/150; 356/401; 257/E23.179; 250/559.29

(58) Field of Classification Search ................ 382/151, 382/100, 141, 145; 430/22, 30, 5, 312; 355/53, 355/77, 67, 55; 702/150, 127, 159; 451/5, 451/285; 356/401, 399, 400; 257/E23.179; 250/491.1, 548, 559.29; 348/87; 383/145, 383/151

See application file for complete search history.

(56) References Cited

U.S. PATENT DOCUMENTS

| | | | | |
|---|---|---|---|---|
| 6,004,706 A | * | 12/1999 | Ausschnitt et al. | 430/30 |
| 6,027,842 A | * | 2/2000 | Ausschnitt et al. | 430/30 |
| 6,406,820 B1 | * | 6/2002 | Ota | 430/30 |
| 6,521,385 B2 | * | 2/2003 | Yoshida et al. | 430/22 |
| 6,654,097 B1 | * | 11/2003 | Nishi | 355/53 |
| 6,822,727 B2 | * | 11/2004 | Shima | 355/53 |
| 7,019,836 B2 | | 3/2006 | Mishima | |
| 7,230,706 B2 | | 6/2007 | Mishima | |
| 2003/0197872 A1 | * | 10/2003 | Littau et al. | 356/625 |

FOREIGN PATENT DOCUMENTS

| | | |
|---|---|---|
| JP | 8-94315 | 4/1996 |
| JP | 2001-319858 | 11/2001 |
| JP | 2003-077806 | 3/2003 |

* cited by examiner

*Primary Examiner*—Sheela Chawan
(74) *Attorney, Agent, or Firm*—Morgan & Finnegan, LLP

(57) ABSTRACT

There is provided a position detecting method for detecting a position of an object, on which an alignment mark including plural mark elements is formed. The method includes the steps of obtaining positional information indicative of each position of the plural mark elements, selecting positional information that has predetermined precision among plural pieces of positional information obtained by the obtaining step, and calculating the position of the object using the positional information that has the predetermined precision selected by the selecting step.

10 Claims, 27 Drawing Sheets

| WAFER NUMBERS | $|L_1-L|$ | $|L_2-L|$ | $|L_2-2L|$ | MK1 | MK2 | MK3 |
|---|---|---|---|---|---|---|
| W1 | ○ | ○ | ○ | – | – | – |
| W2 | ○ | ○ | × | – | – | – |
| W3 | ○ | ○ | ○ | – | – | – |
| W4 | ○ | ○ | ○ | – | – | – |
| W5 | ○ | ○ | ○ | – | – | – |
| W6 | ○ | × | × | ○ | ○ | × |
| W7 | ○ | ○ | ○ | – | – | – |
| W8 | ○ | ○ | ○ | – | – | – |
| W9 | ○ | ○ | ○ | – | – | – |

FIG. 5

| WAFER NUMBERS | $\|L_2-L\|$ | $\|L_3-L\|$ | $\|L_{32}-2L\|$ | MK2 | MK3 | MK4 |
|---|---|---|---|---|---|---|
| W1 | ○ | ○ | ○ | − | − | − |
| W2 | ○ | ○ | × | − | − | − |
| W3 | ○ | ○ | ○ | − | − | − |
| W4 | ○ | ○ | ○ | − | − | − |
| W5 | ○ | ○ | ○ | − | − | − |
| W6 | × | × | ○ | ○ | × | ○ |
| W7 | ○ | ○ | ○ | − | − | − |
| W8 | ○ | ○ | ○ | − | − | − |
| W9 | ○ | ○ | ○ | | | |

FIG. 7

| WAFER NUMBERS | $\|L_1-L\|$ | $\|L_2-L\|$ | $\|L_2-2L\|$ | $\|L_3-L\|$ | $\|L_3-2L\|$ |
|---|---|---|---|---|---|
| W1 | 1.268 | 0.414 | 0.854 | 0.169 | 0.583 |
| W2 | 0.669 | 0.892 | 1.561 | 1.001 | 0.109 |
| W3 | 0.099 | 0.54 | 0.639 | 0.406 | 0.946 |
| W4 | 0.902 | 1.36 | 0.458 | 0.963 | 2.323 |
| W5 | 0.926 | 0.182 | 1.108 | 1.927 | 1.745 |
| W6 | 0.217 | 2.832 | 2.615 | 2.982 | 0.15 |
| W7 | 0.106 | 0.626 | 0.52 | 0.495 | 1.121 |
| W8 | 1.334 | 0.881 | 0.453 | 0.458 | 0.423 |
| W9 | 0.079 | 0.662 | 0.741 | 1.802 | 1.14 |

FIG. 9

| WAFER NUMBERS | $|L_1-L|$ | $|L_2-L|$ | $|L_{2T}-2L|$ |
|---|---|---|---|
| W1 | 1.268 | 0.414 | 0.854 |
| W2 | 0.669 | 0.892 | 1.561 |
| W3 | 0.099 | 0.54 | 0.639 |
| W4 | 0.902 | 1.36 | 0.458 |
| W5 | 0.926 | 0.182 | 1.108 |
| W6 | 0.217 | 0.075 | 0.292 |
| W7 | 0.106 | 0.626 | 0.52 |
| W8 | 1.334 | 0.881 | 0.453 |
| W9 | 0.079 | 0.662 | 0.741 |

FIG. 10

| WAFER NUMBERS | $\|L_2-L\|$ | $\|L_3-L\|$ | $\|L_3-2L\|$ |
|---|---|---|---|
| W1 | 0.414 | 0.169 | 0.583 |
| W2 | 0.892 | 1.001 | 0.109 |
| W3 | 0.54 | 0.406 | 0.946 |
| W4 | 1.36 | 0.963 | 2.323 |
| W5 | 0.182 | 0.182 | 0.091 |
| W6 | 0.075 | 0.075 | 0.15 |
| W7 | 0.626 | 0.495 | 1.121 |
| W8 | 0.881 | 0.458 | 0.423 |
| W9 | 0.662 | 1.802 | 1.14 |

| WAFER NUMBERS | $|L_1-L|$ | $|L_2-L|$ | $|L_3-L|$ | sq |
|---|---|---|---|---|
| W1 | 1.268 | 0.414 | 0.169 | 0.776 |
| W2 | 0.669 | 0.892 | 1.001 | 0.865 |
| W3 | 0.099 | 0.54 | 0.406 | 0.394 |
| W4 | 0.902 | 1.36 | 0.963 | 1.094 |
| W5 | 0.926 | 0.182 | 1.927 | 1.239 |
| W6 | 0.217 | 2.832 | 2.982 | 2.378 |
| W7 | 0.106 | 0.626 | 0.495 | 0.465 |
| W8 | 1.334 | 0.881 | 0.458 | 0.960 |
| W9 | 0.079 | 0.662 | 1.802 | 1.109 |

FIG. 15

FIG. 23A   T 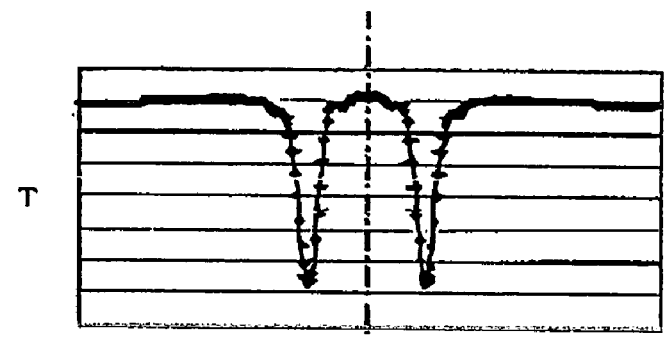
FIG. 23B   S 
FIG. 23C   E 

ABNORMAL MARK-SIGNAL ASYMMETRY

POSITION DETECTING METHOD

This application claims a benefit of a foreign priority based on Japanese Patent Application No. 2003-174263, filed on. Jun. 19, 2003, which is hereby incorporated by reference herein in its entirety as if fully set forth herein.

BACKGROUND OF THE INVENTION

The present invention relates to a position detecting method, and more particularly to a position detecting method for detecting the position of an object, such as a wafer, in an exposure apparatus used to manufacture various devices including semiconductor chips such as ICs and LSIs, liquid crystal displays, CCDs, and magnetic heads. The present invention is suitable, for example, for an alignment between a reticle and a wafer.

With recent demands for smaller and lower profile electronic apparatuses, finer processing of semiconductor devices to be installed in them has been increasingly demanded. In order to manufacture semiconductor devices according to photolithography, a reduction projection exposure apparatus has conventionally been employed which uses a projection optical system to project a circuit pattern on a mask (or a reticle) onto a wafer, etc. to transfer the circuit pattern.

The minimum critical dimension ("CD") to be transferred by the projection exposure apparatus or resolution is proportionate to the wavelength of light used for exposure, and inversely proportionate to the numerical aperture ("NA") of the projection optical system. The shorter the wavelength, the better the resolution. Along with recent demands for finer semiconductor devices, shorter wavelengths of ultraviolet light have been promoted from an ultra-high pressure mercury lamp (such as an i-line with a wavelength of approximately 365 nm) to a KrF excimer laser (with a wavelength of approximately 248 nm), an ArF excimer laser (with a wavelength of approximately 193 nm), an $F_2$ laser (with a wavelength of approximately 157 nm), and a synchrotron radiation ("SR") light.

The projection exposure apparatus needs to execute a highly precise alignment between a reticle and a wafer with finer circuit patterns or higher resolutions. The typical precision necessary for the alignment is about one-third the circuit pattern: For example, the overlay accuracy of 60 nm or smaller is required for a design rule of 0.18 µm for 1-Gbit DRAM circuit patterns. Overlay means an alignment of an entire exposure area.

The high overlay accuracy on a wafer is the vital issue for an exposure apparatus in the current semiconductor industry to improve the performance and manufacture yield or throughput of semiconductor devices. Accordingly, an alignment optical system is used to optically detect the position of an alignment mark formed on a wafer etc., and the wafer is aligned with a reticle, based on the detection result. More specifically, a position of an alignment mark is detected by processing an alignment signal obtained from the alignment mark. Various proposals have been made for signal processing, for example, a folded symmetrical processing that utilizes symmetry of an alignment signal (see, for example, Japanese Patent Application, Publication No. 8-094315).

While a certain alignment repetitively detects positions for all the exposure positions or shots (which is referred to as a "die-by-die system"), a global alignment with a good throughput is usually used. The global alignment measures positional coordinates of plural sample shots on a wafer, statistically processes the measured values, and calculates the shift, magnification and rotational errors of the wafer. After the wafer coordinate system is corrected based on these errors, the stepwise movement to each shot follows. Used more recently is an advanced global alignment ("AGA") that develops the global alignment and measures a wafer's position by relying on the accuracy of an XY stage that is equipped with a laser interferometer. The AGA calculates the wafer's magnification, rotation and shift amounts, and applies statistical processing, such as the removal of an abnormal value. The abnormal-value removal calculates the average and standard deviation from the measured values of the shots, and eliminates the measured value of a greatly deviated shot.

However, the introduction of special semiconductor manufacture technology, such as a chemical mechanical polishing ("CMP") process, causes alignment-mark shapes to scatter among wafers and shots, lowering the alignment accuracy disadvantageously. This is because the process condition including a coating, etching and CMP is optimized for fine circuit patterns with CDs between 0.1 µm to 0.15 µm, and is not optimized for alignment marks having large CDs, for example, between 0.6 µm to 4.0 µm, as the difference between the CD of the circuit pattern and that of the alignment mark increases with fine processing of the circuit pattern.

While it is conceivable to fit the alignment mark's CD with the circuit pattern's CD, the lack of resolution of the alignment optical system reduces the signal strength or contrast, and deteriorates the alignment signal's stability. In addition, the alignment optical system for detecting an alignment mark having a CD equivalent to the circuit pattern requires a high NA and a short-wave alignment light source, increasing the cost of an apparatus.

Moreover, a wafer-induced shift ("WIS") causes a large error in the detection result or makes an alignment signal asymmetrical, and deteriorates the alignment accuracy. That major factor results in an asymmetrical alignment mark and/or resist. An interaction between the WIS and a tool induced shift ("TIS") results from an exposure apparatus or an alignment optical system, i.e., a TIS-WIS interaction, and also deteriorates the alignment accuracy.

The AGA provides abnormal-value removal to the measured values that include these errors, and measures substitute shots when there are many abnormal shots. However, a measurement of the substitute shot includes an error due to the WIS, and the problem may not be solved completely due to a measurement error amount, although it is small.

An overlay result is confirmed after an exposure, and an overlay error is eliminated through an offset correction. However, the offset correction lowers the throughput, and thus is practically conducted for each lot or for each process. Therefore, the problem still remains. It is possible to identify a shot that causes an error based on the overlay result, but it takes a long time.

BRIEF SUMMARY OF THE INVENTION

Accordingly, it is an exemplified object of the present invention to provide a position detecting method that reconciles the necessary alignment accuracy and the throughput even when the detection results of alignment marks scatter.

A position detecting method according to one aspect of the present invention for detecting a position of an object, on which an alignment mark including plural mark elements is formed, includes the steps of obtaining positional information indicative of each position of the plural mark elements, selecting positional information that has predetermined precision among plural pieces of positional information obtained by the obtaining step, and calculating the position of the object using the positional information that has the predetermined precision selected by the selecting step.

Other objects and further features of the present invention will become readily apparent from the following description of the embodiments with reference to the accompanying drawings.

BRIEF DESCRIPTION OF THE DRAWINGS

FIG. 5 is a schematic view showing an abnormality discrimination result of three adjacent mark elements out of the eight mark elements in the alignment mark.

FIG. 7 is a view showing an abnormality discrimination result of three adjacent mark elements among the eight mark elements in the alignment mark.

FIG. 9 is a view showing residual values between mark-interval measurement values in the alignment mark shown in FIG. 4 and designed reference values.

FIG. 10 is a view of the result of Equation 7 applying to residuals between the mark-interval measured values shown in FIG. 9 and designed reference values.

FIG. 12 is a view of the result of Equation 10 or 11 applying to residual values between the mark-interval measured values shown in FIG. 9 and designed reference values.

FIG. 14 is a schematic plane view showing a layout of shots subject to alignment measurements.

FIG. 15 is a view of residuals between the mark-interval measured values, designed reference values, and mean square error values.

FIG. 23 shows a pattern or template matching applicable to the detection result shown in FIG. 22.

DETAILED DESCRIPTION OF THE PREFERRED EMBODIMENTS

Figure 1:
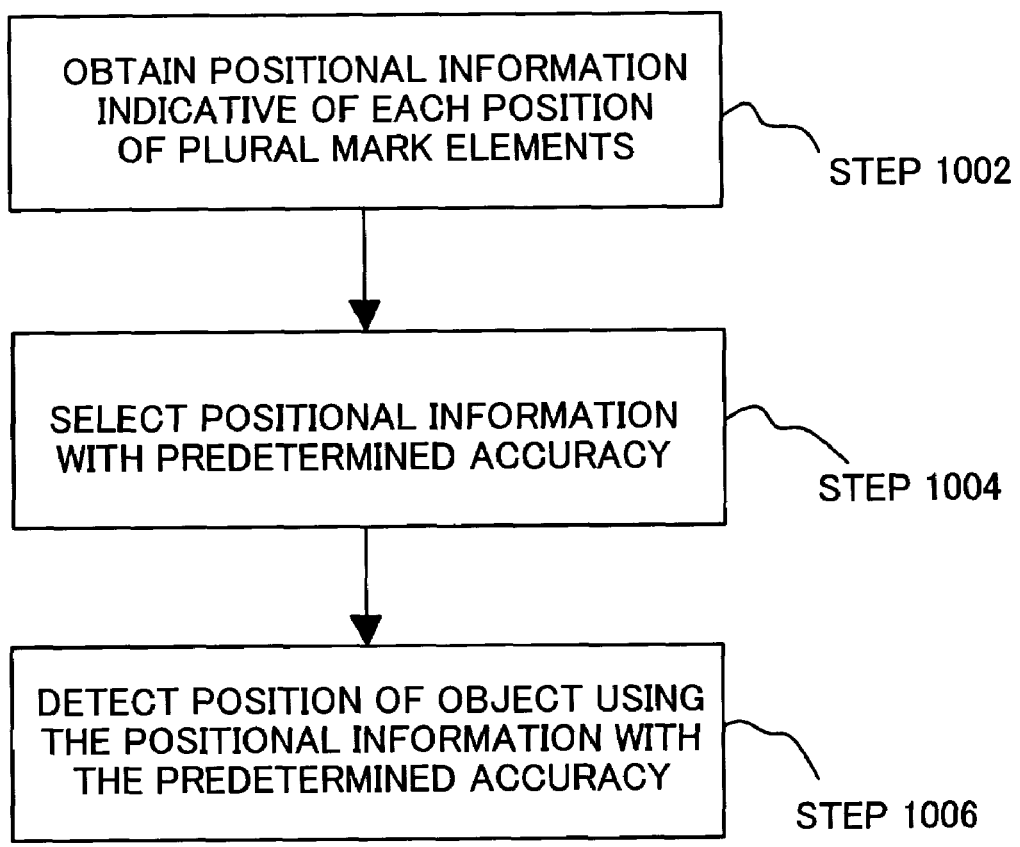
FIG. 1 is a flowchart for the explanation of a position detecting method according to one aspect of the present invention.

A description will now be given of an inventive position detecting method, with reference to the accompanying drawings. The same element in each figure is designated by the same reference numeral, and a description thereof will be omitted.

Figure 17:
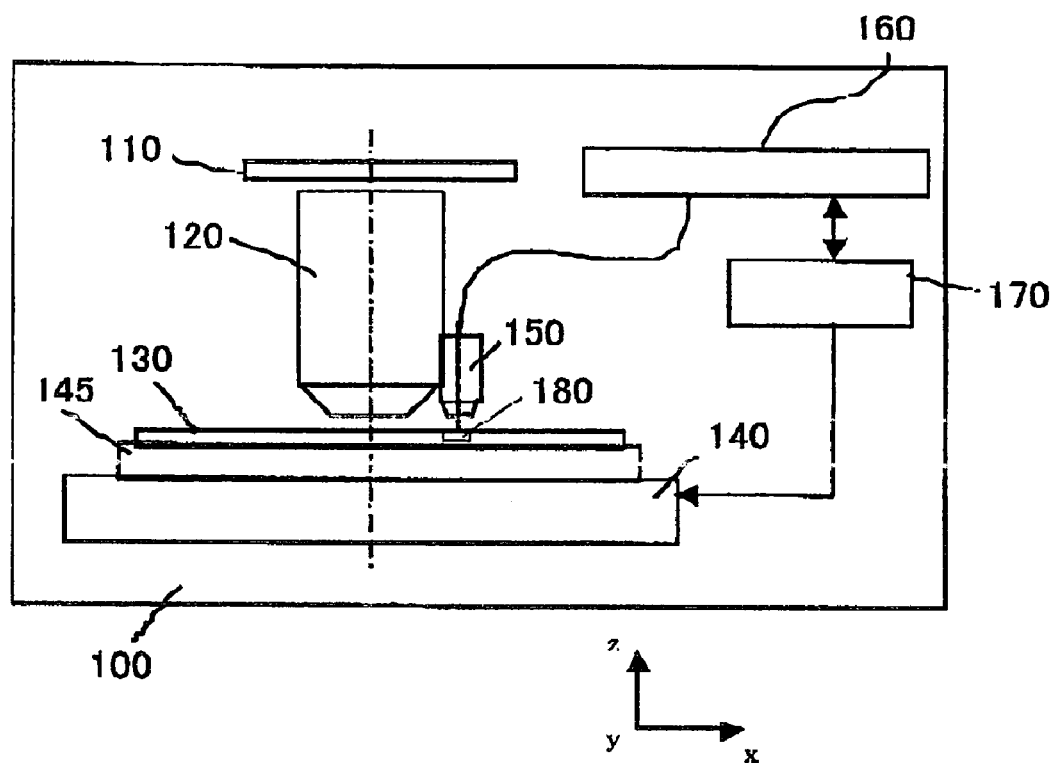
FIG. 17 is a schematic view of an exposure apparatus of one embodiment according to the present invention.

FIG. 17 is a schematic view of an exposure apparatus 100 according to one aspect of the present invention. The exposure apparatus 100 is a projection exposure apparatus that exposes onto a wafer the circuit pattern on a reticle, e.g., in a step-and-repeat or a step-and-scan manner. Such an exposure apparatus is suitable for a sub-micron or quarter-micron lithography process, and this embodiment exemplarily describes a step-and-scan exposure apparatus (which is also called "a scanner"). The "step-and-scan manner", as used herein, is an exposure method that exposes a mask pattern onto a wafer by continuously scanning the wafer relative to the mask, and by moving, after a shot of exposure, the wafer stepwise to the next exposure area to be shot. The "step-and-repeat manner" is another mode of an exposure method that moves a wafer stepwise to an exposure area for the next shot every shot of cell projection onto a wafer.

Referring to FIG. 17, the exposure apparatus 100 includes a projection optical system 120 for projecting a reduced size of a reticle 110 that has a desired pattern (such as a circuit pattern), a wafer chuck 145 that holds a wafer 130, onto which a primary coat pattern and alignment marks 180 have been formed in a pretreatment step, a wafer stage 140 that positions the wafer 130 at a predetermined position, an alignment optical system (or alignment scope) 150 that measures a position of the alignment mark 180 on the wafer 130, an alignment signal processor 160, and a controller 170.

FIG. 17 omits a light source, and an illumination optical system for illuminating the reticle 110 using light from the light source. The controller 170 includes a CPU and a memory (not shown), and controls actions of the exposure apparatus 100. The controller 170 is electrically connected to the reticle stage (not shown), the wafer stage 140, and the alignment signal processor 160. The controller 170 positions the wafer 130 through the wafer stage 140 based on the positional information of the alignment mark from the alignment signal processor 160.

Figure 18:
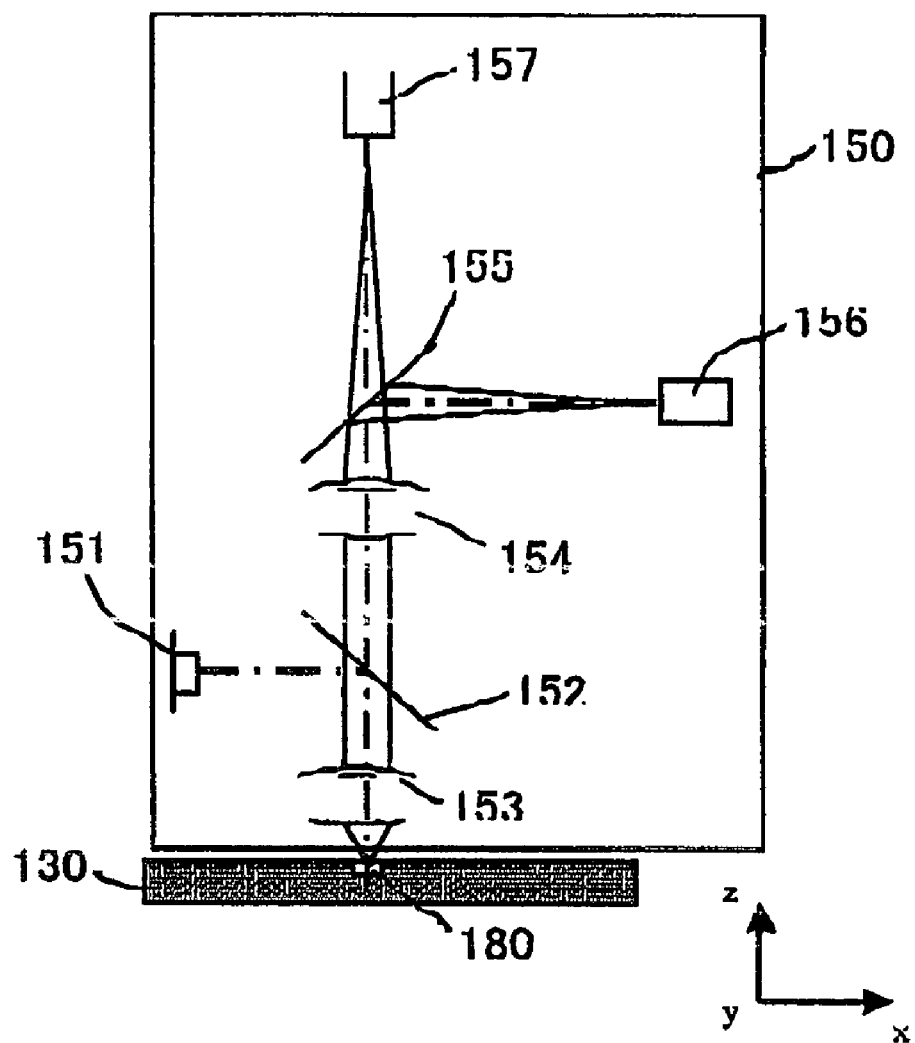
FIG. 18 shows a schematic optical path for principal elements in the alignment optical system shown in FIG. 17.

A description will now be given of the detection principle of an alignment mark 180. FIG. 18 shows the schematic optical path of the main elements in the alignment optical system 150 shown in FIG. 17. Referring to FIG. 18, the illumination light from an alignment light source 151 passes through a lens 153 after being reflected from a beam splitter 152, and illuminates an alignment mark 180 on the wafer 130. The (reflected or diffracted) light from the alignment mark 180 passes through the lens 153, the beam splitter 152, and a lens 154, and is divided by a beam splitter 155, and received by CCD sensors 156 and 157.

The alignment mark 180 is magnified by an imaging magnification of about 100 times by lenses 153 and 154, and imaged on the CCD sensors 156 and 157. The CCD sensors 156 and 157 are used to measure the offsets of the alignment mark 180 in the X and Y directions, respectively, and are arranged at a rotational angle of 90° relative to the optical axis. The CCD sensor may use a line sensor, which preferably uses, in this case, a cylindrical lens having power in a direction perpendicular to the measurement direction for condensation in the direction perpendicular to the measurement direction, optical integration, and averaging.

Figure 19A:
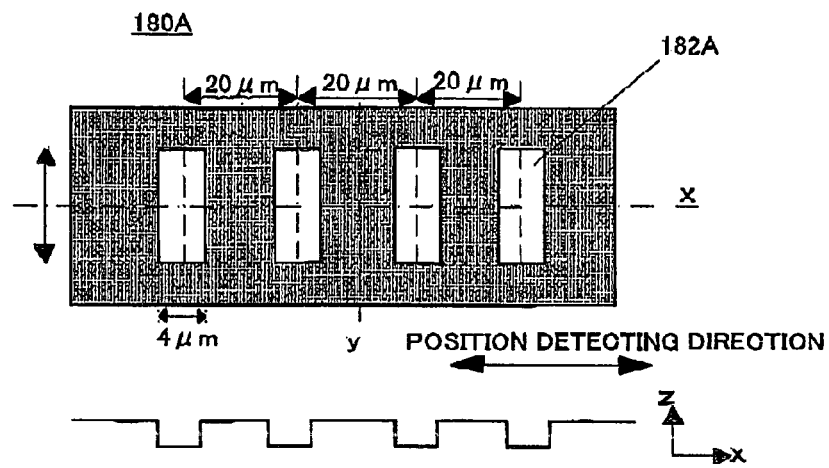
FIGS. 19A and 19B show schematic plane sectional views of the alignment mark shown in FIG. 17.
Figure 19B:
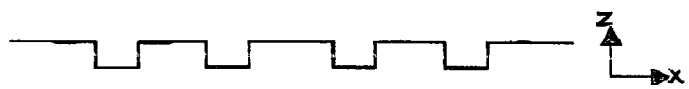
Figure 20A:
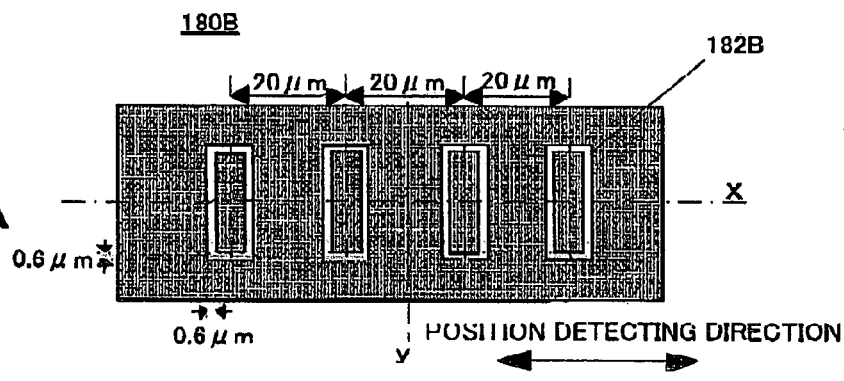
FIGS. 20A and 20B show schematic plane sectional views of the alignment mark shown in FIG. 17.
Figure 20B:

The alignment marks 180 are arranged on a scribe line for each shot, and may use for example, alignment marks 180A and 180B shown in FIGS. 19A, 19B, 20A and 20B. The alignment mark 180 generalizes alignment marks 180A and 180B. Here, FIGS. 19A and 19B are plane sectional views of the alignment mark 180A shown in FIG. 17. FIGS. 20A and 20B are plane sectional views of the alignment mark 180B shown in FIG. 17. In FIGS. 19A, 19B, 20A and 20B, each of the alignment marks 180A and 180B include four mark elements 182A and 182B arranged at regular intervals. FIGS. 19A, 19B, 20A and 20B omit the resist, which is actually applied to the alignment marks 180A and 180B.

The alignment mark 180A arranges, as shown in FIG. 19A, four rectangular mark elements 182A at a pitch of 20 μm in a direction X, each of which has a size of 4 μm in a measurement direction X and 20 μm in a non-measurement direction Y. The mark element 182A has a concave sectional shape as shown in FIG. 19B. The alignment mark 180B arranges four mark elements 182B, each of which replaces, as shown in FIGS. 20A and 20B, a contour of the mark element 182A in FIGS. 19A and 19B with a line width (critical dimension) of 0.6 μm.

Figure 21:
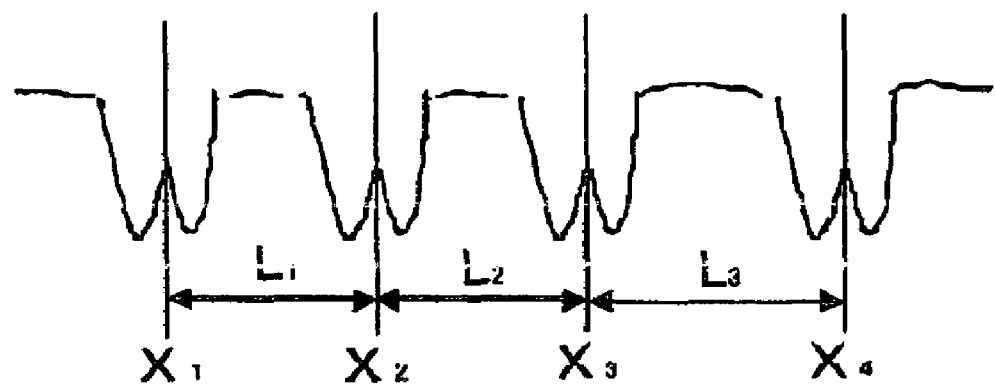
FIG. 21 is a graph showing a typical detection result when the alignment marks shown in FIGS. 19A, 19B, 20A and 20B are optically detected.

Whichever is used, the alignment mark 180A or 180B in FIGS. 19A and 19B or 20A and 20B, the CCD sensor 156 generally takes an image as shown in FIG. 21, due to a generation and interference of scattered rays at a lens' edge outside a NA of the lenses 153 and 154 in the alignment optical system 150. The alignment mark 180A has a dark contour, while the alignment mark 180B has a dark or bright concave part, as characterized and often observed by a bright field. Here, FIG. 21 is a graph showing a typical detection result when the alignment marks 180A and 180B shown in FIGS. 19A, 19B, 20A and 20B are optically detected.

Figure 22:
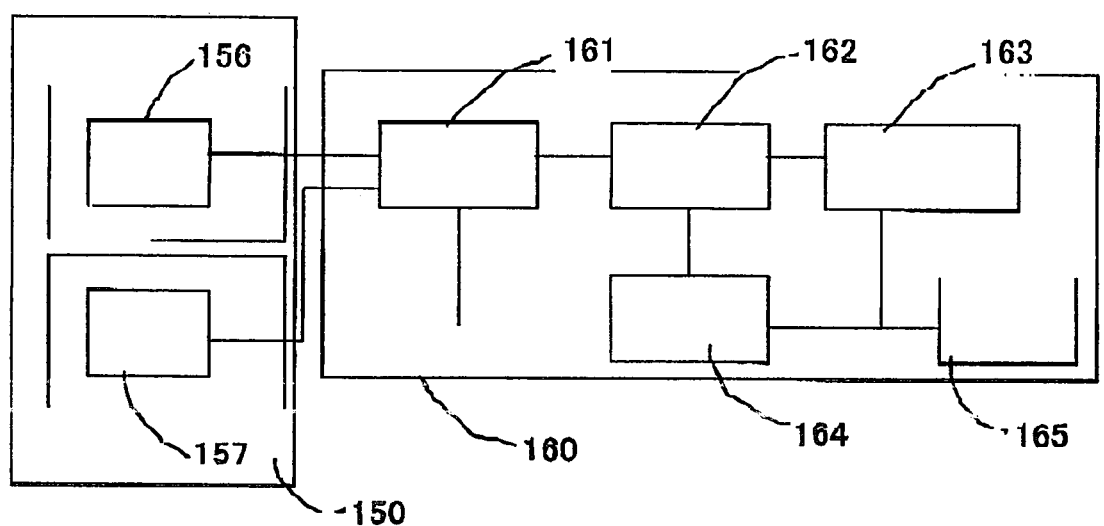
FIG. 22 is a schematic block diagram showing main functional modules in the alignment signal processor shown in FIG. 17.

The alignment signal processor 160 performs signal processing for an image of the alignment mark 180, which has been thus taken, as follows: FIG. 22 is a schematic block diagram showing main functional modules in the alignment signal processor 160 shown in FIG. 17.

Referring to FIG. 22, an A/D converter 161 digitalizes the alignment signals from the CCD sensors 156 and 157. Various signal processors in a storage unit 162 remove noise from the digitalized alignment signal, and store the resultant signal in memory. A mark center detector 163 performs a digital signal processing for a stored digitalized alignment signal. The mark center detector 163 executes a position detecting method 1000, which will be described later, by an operational element for the digitalized alignment signal, and detects a center position of the alignment signal. The CPU 164 is connected to an A/D converter 161, the storage unit 162, the mark center detector 163, and outputs control signals to them so as to control their actions. The communication part 165 communicates with the controller 170 shown in FIG. 17 for communication of necessary data, control commands, etc.

Various methods have been proposed to the digital signal processing by the mark center detector 163, which includes a method for detecting edge parts of the alignment signal and for calculating the distance between the edges, and a template or pattern matching that uses a normalized function. The present invention proposes a position detecting method 1000 for detecting a center position in the alignment signal as one example of a digital signal processing. The signal source may be a two-dimensional or one-dimensional signal. A two-dimensional image is voting-processed after its horizontal pixels are arranged in a perpendicular direction to create a histogram, averaged with respect to the main components, and converted into a one-dimensional image. The proposed, inventive digital signal processing independently performs X and Y measurements, and the base signal processing for positioning is a one-dimensional signal processing. For example, the digital signals representative of the two-dimensional images on the CCD sensors 156 and 157 are integrated and averaged, and converted into a one-dimensional line signal.

First, the instant inventors, as a result of studies of the template matching as a conventional digital signal processing, have found that various improvements are available. A description will be given of these problems:

The template matching correlates an obtained signal S shown in FIG. 23B with a model signal or a template T shown in FIG. 23A that has been stored in the apparatus, and detects the position having the highest correlation as a center of the alignment mark. Resolutions 1/10 to 1/50 can be selected by calculating a barycenter pixel position in an area that ranges several pixels to the right and left from the peak pixel using a correlation-value function E shown in FIG. 23C. Here, FIG. 23 is a view showing a template matching applicable to the detection result shown in FIG. 22.

The template matching uses the following Equation 1, where S is the signal obtained by the CCD sensor, T is the model signal or template, and E is the correlation result:

$$E(X) = \frac{1}{\sum_{J=-k}^{k} [S(X+J) - T(J)]^2} \quad (1)$$

FIG. 23 shows a relationship among the signal S, the model signal T, and the correlation value E. FIG. 7 shows the processing of one mark-element image among four mark elements 181. Here, X that maximizes the correlation value E is considered to be a position of the mark image. Another proposed method determines a position of an alignment mark by performing a correlation operation for the model signal T and by returning the left half of the signal S using waveform symmetry. Alternatively, it is possible for improved precision of the correlation value E to calculate a coordinate position in an X direction through an interpolation using a spline function, a Gauss function, etc., and to set the coordinate position to a center position of the mark element 181.

As applied similarly hereinafter, the template matching detects image positions on the CCD sensor for the other three mark elements.

FIG. 21 is an alignment signal obtained by integrating and averaging a digitalized alignment signal in a mark measurement position direction. Use of a one-dimensional line sensor and optical condensing would eliminate a conversion from a two-dimensional image after image processing to a one-dimensional image.

The template matching calculates mark-element image positions $X_1$, $X_2$, $X_3$ and $X_4$ (where the unit is a pixel). The center coordinate Xa of the whole alignment mark 180 expressed by the following Equation 2 is calculated by averaging the center positions $X_1$ to $X_4$ of, the four mark-element images:

$$Xa = \frac{X_1 + X_2 + X_3 + X_4}{4} \quad (2)$$

As a result, the following Equation 3 calculates a the positional offset of the alignment mark 180 on the wafer 130, where M is the imaging magnification of the alignment optical system 150, and Px is the pixel pitch of the CCD sensor 156 in the alignment measurement direction:

$$Xw = \frac{Xa}{Px \cdot M} \quad (3)$$

For example, a positional offset of one pixel on the CCD sensor 156 corresponds to the positional offset Xw of the alignment mark 180 on the wafer 130 of 24 μm/100=240 nm, where the imaging magnification M of the alignment optical system 150 is 100, and the pixel pitch Px is 24 μm.

The conventional signal processing, typified by template matching, does consider the accuracy deterioration under the influence of the WIS, and overlooks the influence of the WIS. The conventional signal processing measures an image for each mark element, averages the measurement results corresponding to the number of mark elements, and reduces the deterioration of the measurement accuracy due to the partial defects of the mark elements (averaging effect). However, the inventors have found that conventional averaging cannot satisfy the recent demands for highly precise alignment with fine processing of semiconductor devices.

Accordingly, the inventors propose, rather than the conventional averaging effect, the positional detecting method 1000 that eliminates erroneous information and prevents a deterioration of the measurement accuracy by using only information having a predetermined accuracy. The inventive positional detecting method 1000 is suitable when information derives from a mark element whose center position is remarkably offset among plural mark elements in the alignment mark. The position detecting method 1000 is a signal processing that does not generate an alignment error due to the WIS, more specifically, an asymmetrical shape of the alignment mark.

Figure 24:
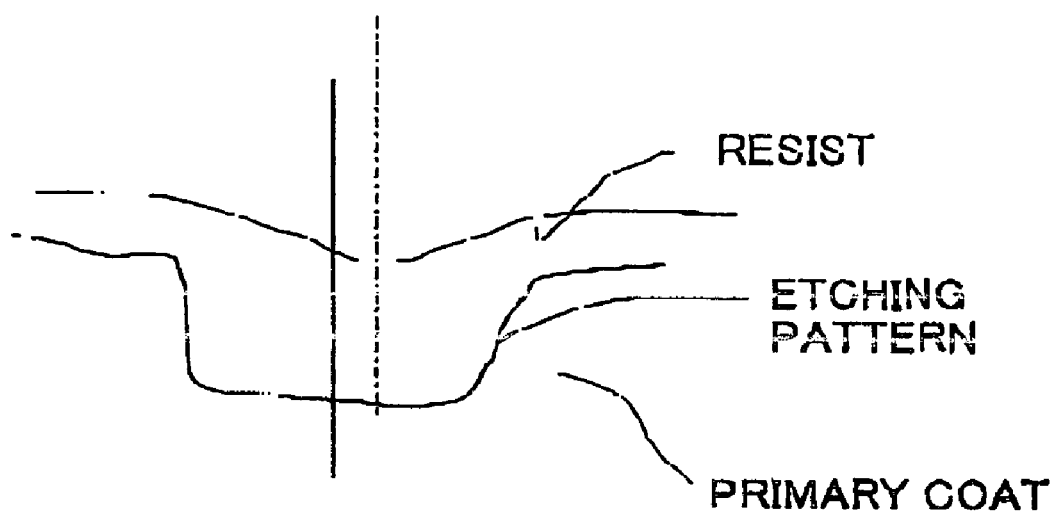
FIG. 24 is a schematic view showing one example where a measurement position of a mark element shifts under the influence of the WIS.

In the signal processing using conventional template matching, the WIS can cause a detection coordinate of a center position of the mark element to shift as shown in FIG. 24. Referring to FIG. 24, a resist that is etched on a primary coat asymmetrically or shifts from the center of a pattern, shifts to the right. Here, FIG. 24 is a schematic view showing one example where the measurement position of a mark element shifts under the influence of the WIS (alignment asymmetry).

In a case where detected alignment signals are compared every four mark elements, only one of four mark elements, for example, has a distortional waveform under the influence of the WIS. Conceivably, this is because a grain adheres around the one mark element or because the resist's coating thickness partially changes due to bad wafer processing and thus the reflectance changes.

Figure 25:
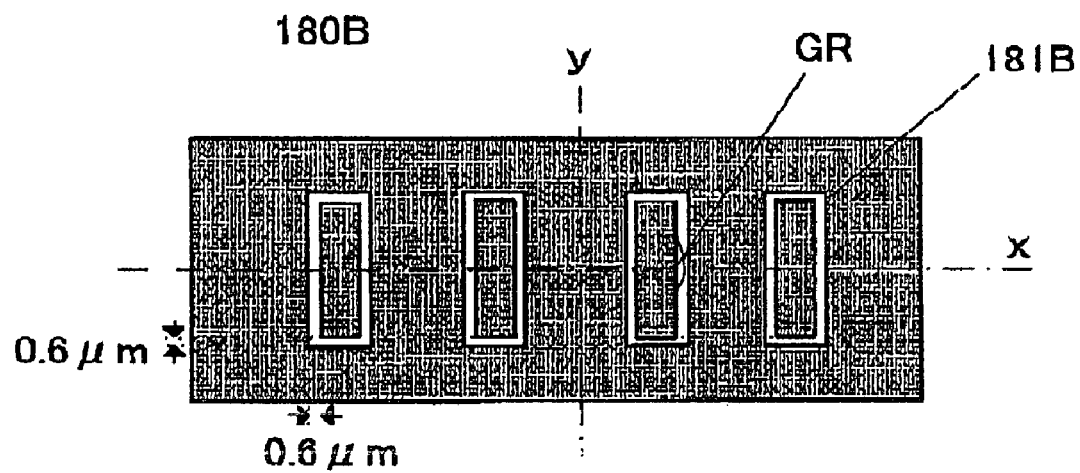
FIG. 25 is a schematic plane view of an alignment mark, where a grain adheres to the right edge of the third mark element from the left among four mark elements.
Figure 26:
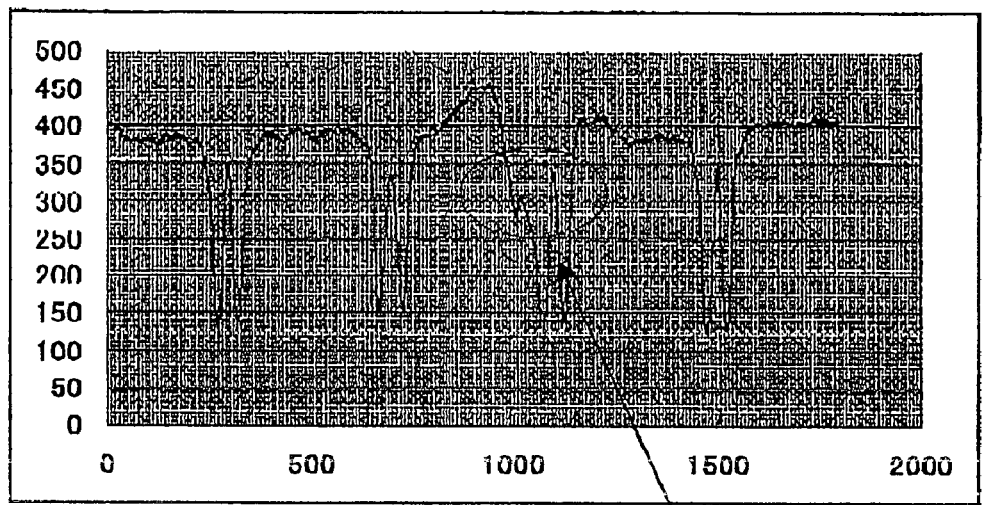
FIG. 26 is a graph showing one example in which an alignment signal detected from the alignment mark shown in FIG. 25 has a partially distortional waveform.

FIG. 25 is a schematic plane view of an alignment mark 180B when a grain GR adheres to the right edge of the third mark element from the left among four mark elements. Under the influence of the grain GR, the detected alignment signal contains greatly distortional parts. FIG. 26 is a graph showing one example in which an alignment signal detected from the alignment mark 180B shown in FIG. 25 has a partially distortional waveform. Referring to FIG. 26, the third mark element 181B among the four mark elements 181B contains a distortion or noise component that enhances the asymmetry of the alignment signal waveform. An application of conventional signal processing, such as the template matching, to such an alignment signal would cause the center position of the mark element to shift under the influence of the distortion in the measurement.

Figure 27:
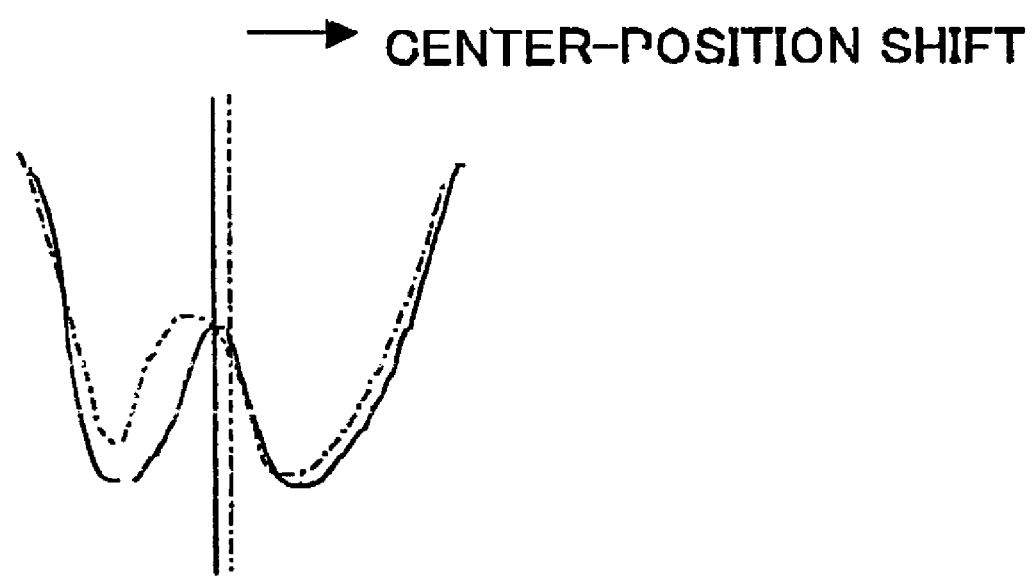
FIG. 27 is a view showing that a waveform of part of a mark element differs from a waveform of another mark element due to the distortional waveform in the alignment signal.

FIG. 27 is a view showing that the waveform of part of a mark element differs from the waveform of another mark element due to the distortional waveform in the alignment signal. FIG. 27 extracts a waveform of each mark element 181B from the detected alignment signal from the alignment mark 180B shown in FIG. 25 (or divides the alignment signal every 20 μm, or the interval in the mark elements 181B), and superimposes the waveform of each mark element 181B from which the difference of pixels corresponding to the interval 20 μm in the mark elements 181B is subtracted. Two characteristic waveforms are shown among the waveforms of the four mark elements 181B extracted from the detected alignment signal from the alignment mark 180B, and others are omitted because they overlap the solid line.

Referring to FIG. 27, a broken-line waveform of part of the mark element 181B has different left and right mark widths. An application of the conventional signal processing or template matching would cause a shift of a center position even in this case, because a shifted waveform of the part of the mark element 181B influences the positional offset of the entire alignment mark 180B and causes an alignment measurement error.

A description will be given of the inventive position detecting method 1000 as an example of a digital signal processing by a mark center detector 163 in the alignment signal processor 160, with reference to FIGS. 1 to 16.

FIG. 1 is a flowchart to explain a position detecting method according to one aspect of the present invention. The position detecting method 1000 detects the position of an object, on which the alignment mark including plural mark elements is formed.

Referring to FIG. 1, positional information indicative of each position of the plural mark elements is obtained as a predetermined mark interval among plural mark elements by detecting each center position of the mark elements in the alignment signal (step 1002).

Then, positional information having predetermined accuracy is selected among plural pieces of positional information indicative of each position of the plural mark elements obtained in step 1002 (step 1004). A position of the object is detected using the positional information having the predetermined accuracy selected by the step 1004. In other words, the position detecting method 1000 removes the inaccurate positional information, and uses only the positional information having predetermined accuracy to detect the position of the object. It is also possible to calculate the removed, inaccurate positional information from the positional information that has predetermined accuracy.

A description will now be given of a selection of positional information in the step 1004, which is the most characteristic step in the position detecting method 1000.

Figures 2, 3:
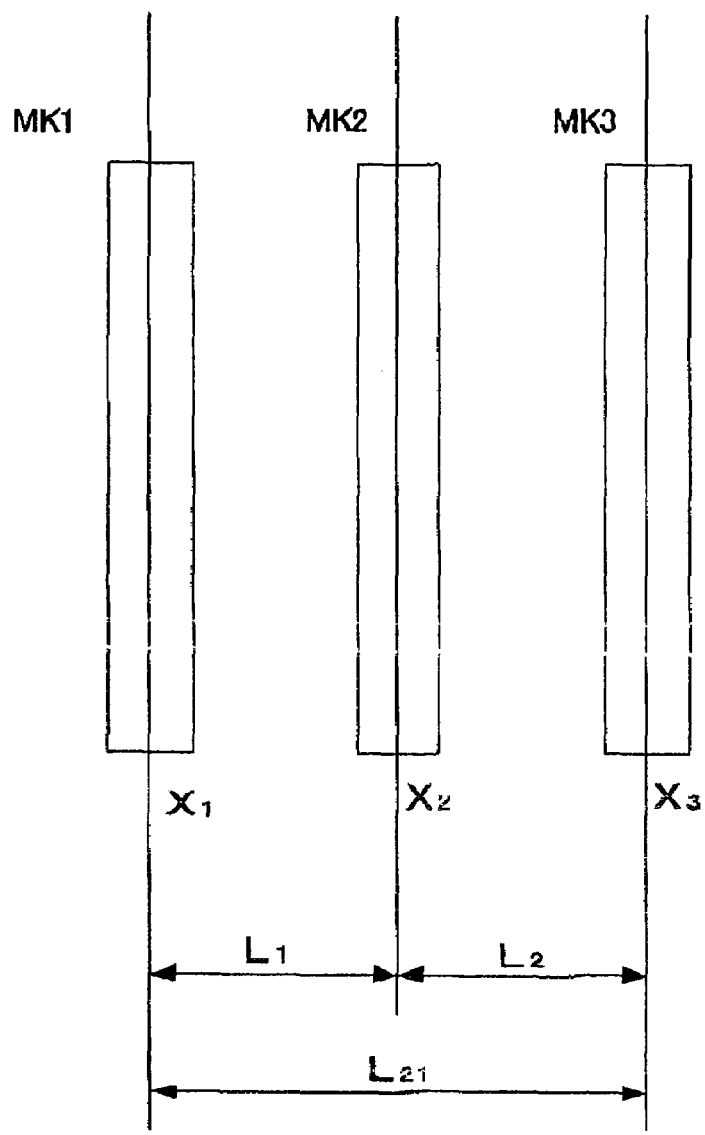
FIG. 2 is a schematic plane view showing an alignment mark that has three mark elements.
FIG. 3 is a view showing an abnormality discrimination result of the three mark elements in the alignment mark.

FIG. 2 is a schematic plane view showing an alignment mark that has three mark elements MK1 to MK3. Referring to FIG. 2, $X_1$ to $X_3$ are center positional coordinates of the adjacent mark elements MK1 to MK3 as a result of signal processing. $L_1$ indicates an interval (or a mark interval) between the center-position coordinates of the mark element MK1 and the mark element MK2, i.e., $L_1=X_2-X_1$. Similarly, $L_2$ indicates a mark interval between the mark element MK3 and the mark element MK2. $L_{21}$ is a mark interval between the mark elements MK3 and the mark element MK1. The center position coordinate increases in the right direction.

A normal measurement provides the designed mark interval $L_o$ without magnification to the normal mark elements MK1 to MK3, like $L_1=L_2=L_o$ and $L_{21}=2L_o$. The measurement accuracy is determined using a certain mark interval as a characteristic amount of the base mark elements MK1 to MK3. This determination combined with the mark elements in the alignment mark immediately identifies a mark element that is abnormal or contains an error according to the measurement.

When the mark interval has a designed value of $L_o$ (unit: μm) among the mark elements MK1 to MK3, an abnormal mark element is identified among the three mark elements MK1 to MK3 by using the following Equations 4 to 6, where L is a reference value that is previously calibrated with respect to a magnification peculiar to the apparatus, and δL is an allowable error or offset amount in the mark interval:

$$|L_1-L|<\delta L \quad (4)$$

$$|L_2-L|<\delta L \quad (5)$$

$$|L_{21}-2L|<\delta L \quad (6)$$

FIG. 3 is a view showing a result that determines the abnormality in the three mark elements in the alignment mark. FIG. 3 assigns "o" that satisfies each of Equations 4 to 6 and "x" that does not satisfy each of Equations 4 to 6.

In FIG. 3, a condition to consider the mark element MK2 to be abnormal is a combination of "x" for Equation 4, "x" for Equation 5, and "o" for Equation 6. It is a condition to consider the mark element MK1's abnormality is a combination of "x" for Equation 4, "o" for Equation 5, and "o" for Equation 6. It is a condition to consider the mark element MK1's abnormality is a combination of "o" for Equation 4, "x" for Equation 5, and "x" for Equation 6. Using these determinations as a basic form, the measurement accuracy is determined for all the mark elements in the alignment mark.

The discriminantal algorithm is easily created with software discriminantal text, such as "If Then Else".

Figure 4:
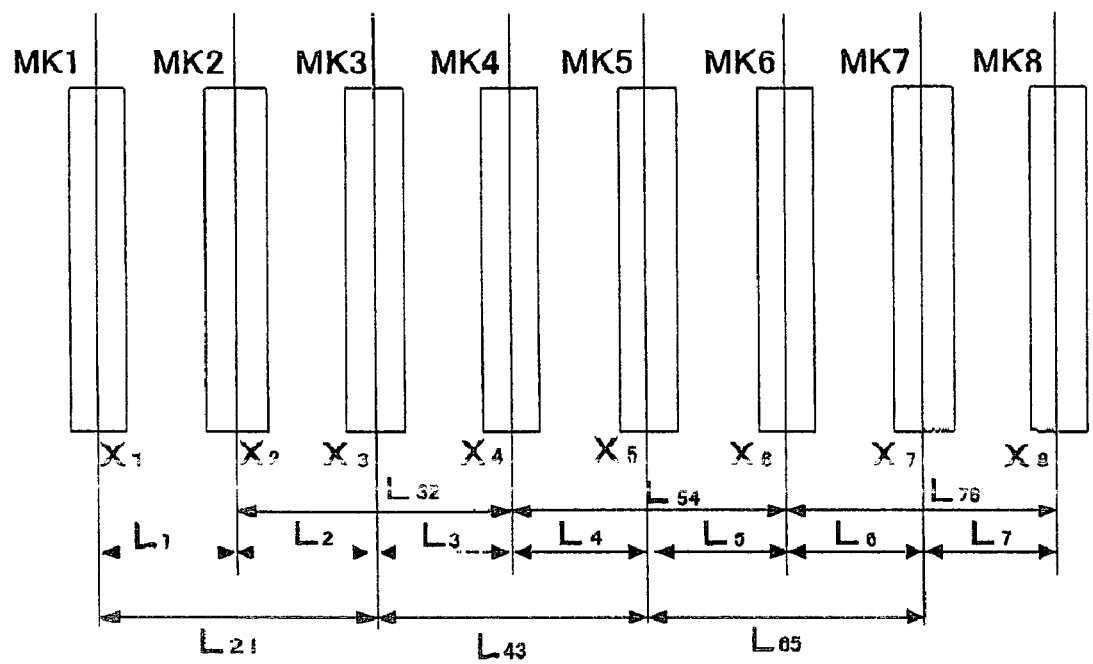
FIG. 4 is a schematic plane view showing an alignment mark that has eight mark elements.

FIG. 4 is a schematic plane view showing an alignment mark that has eight mark elements MK1 to MK8. Referring to FIG. 4, $X_1$ to $X_8$ are center positional coordinates of the adjacent mark elements MK1 to MK8 as a result of the signal processing. $L_1$ indicates an interval (or a mark interval) between the center-position coordinates of the mark element MK1 and the mark element MK2, i.e., $L_1=X_2-X_1$. Similarly, $L_2$ indicates a mark interval between the mark element MK3 and the mark element MK2. $L_3$ indicates a mark interval between the mark element MK4 and the mark element MK3. $L_4$ indicates a mark interval between the mark element MK5 and the mark element MK4. $L_5$ indicates a mark interval between the mark element MK6 and the mark element MK5. $L_6$ indicates a mark interval between the mark element MK7 and the mark element MK6. $L_7$ indicates a mark interval between the mark element MK8 and the mark element MK7. $L_{21}$ is a mark interval between the mark elements MK3 and the mark element MK1. $L_{32}$ is a mark interval between the mark elements MK4 and the mark element MK2. $L_{43}$ is a mark interval between the mark elements MK5 and the mark element MK3. $L_{54}$ is a mark interval between the mark elements MK6 and the mark element MK4. $L_{65}$ is a mark interval between the mark elements MK7 and the mark element MK5. $L_{76}$ is a mark interval between the mark elements MK8 and the mark element MK6. The center position coordinate increases in the right direction.

In this case, six combinations from a combination of the mark intervals $L_1$, $L_2$ and $L_{21}$ to a combination the mark intervals $L_6$, $L_7$ and $L_{76}$ are investigated to check whether the mark elements MK1 to MK8 are abnormal. The averaging effect can decrease scattering errors in the center position coordinates $X_1$ to $X_8$ of the mark elements MK1 to MK8 as the number of mark elements MK1 to MK8 increases.

FIG. 5 is a schematic view showing an abnormality discrimination result of three adjacent mark elements MK1 to MK3 out of the eight mark elements MK1 to MK8 in the alignment mark. Equations 4 to 6 are used to check whether mark elements MK1 to MK3 are abnormal. A residue that exceeds 1.5, i.e., δL≧1.5, between the mark-interval measured value and the designed reference value, is determined abnormal and assigned "x".

Figure 6:
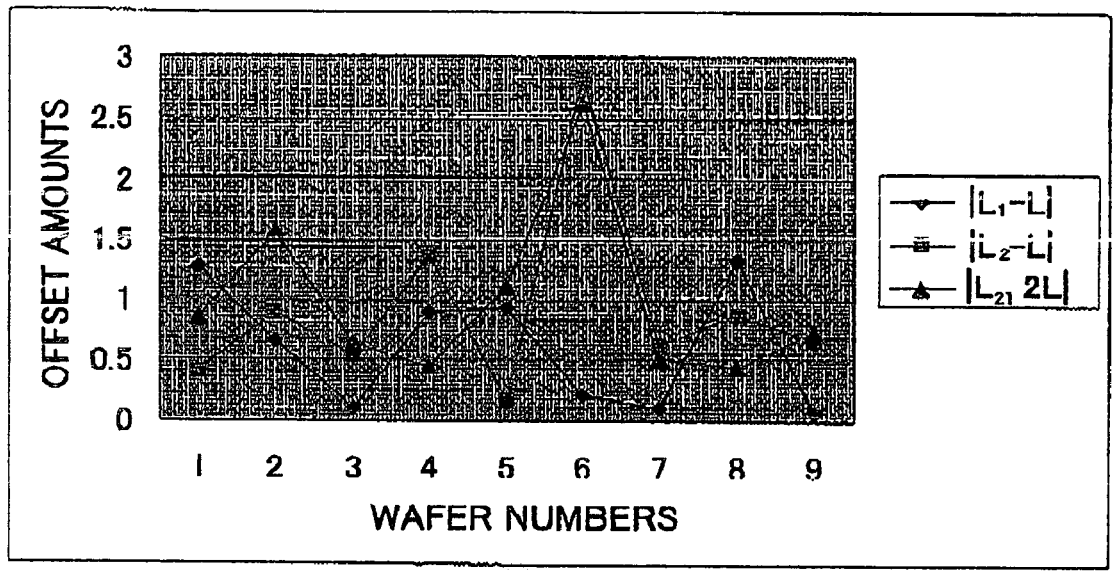
FIG. 6 is a graph that plots the result shown in FIG. 5, where the abscissa axis represents wafer numbers and the ordinate axis represents offset amounts or residuals between mark-interval measured values and designed reference values.

FIG. 5 determines abnormal the measurement result of the center position coordinate $X_3$ obtained from the mark element MK3 of the wafer no. W6. FIG. 6 is a graph that plots a result shown in FIG. 5 where the abscissa axis represents wafer numbers and the ordinate axis represents offset amounts or residuals between mark-interval measured values and designed reference values. It is understood even from FIG. 6 that mark intervals |$L_2$-L| and |$L_{21}$-L| have greatest offset amounts in the wafer no. W6, and the mark element MK3 is abnormal.

Figure 8:
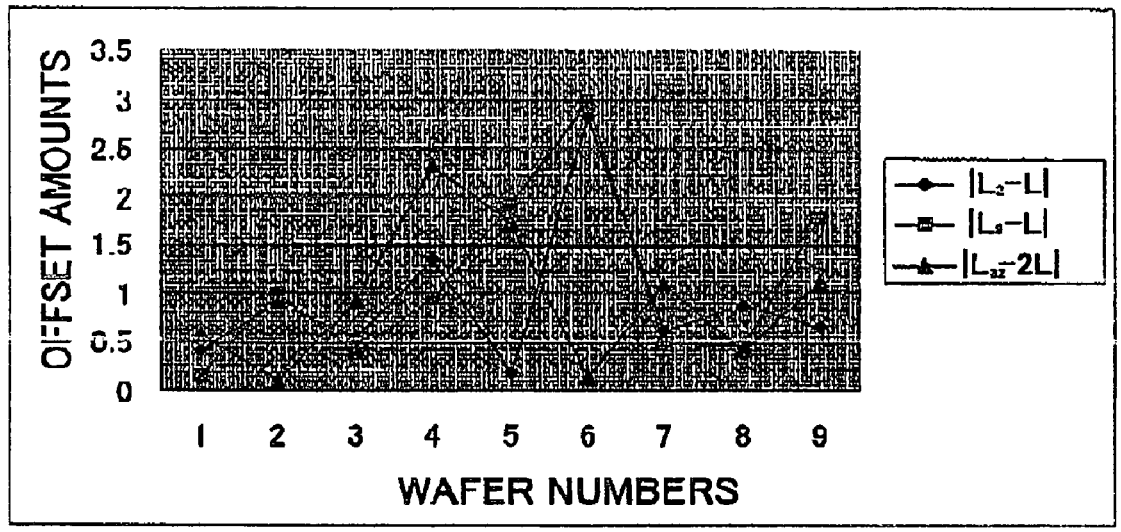
FIG. 8 is a graph that plots a result shown in FIG. 7 where the abscissa axis represents wafer numbers and the ordinate axis represents offset amounts or residuals between mark-interval measured values and designed reference values.

A result of a similar check of a combination of the mark elements MK2 to MK4 at the right side in the same alignment mark will be given. FIG. 7 is a view showing an abnormality discrimination result of three adjacent mark elements MK2 to MK4 among the eight mark elements MK1 to MK8 in the alignment mark. FIG. 8 is a graph that plots a result shown in FIG. 7 where the abscissa axis represents wafer numbers and the ordinate axis represents offset amounts or residuals between mark-interval measured values and designed reference values. It is understood from FIGS. 7 and 8 that the mark element MK3 of the wafer no. 6 is abnormal.

Data useful for process control is produced, for example, by storing the process data from these discriminations in the form of a database. This database contains detection data and quantitative data of abnormal mark elements, and is useful for quantification of the WIS.

The alignment can eliminate a measured value of the abnormal mark element, and use only measured values from the remaining mark elements. Alternatively, the alignment can calculate a value that is a corrected measured value of the abnormal mark element, and use the corrected value. In any event, the alignment uses only the measured values having the predetermined accuracy.

FIG. 9 is a view showing residual values between mark-interval measurement values in the alignment mark shown in FIG. 4 and designed reference values. It is understood from FIG. 9 that the center position coordinate $X_3$ of the mark element MK3 in the wafer no. W6 is abnormal.

A center position coordinate $X_3'$ of the mark element MK3 given by the following Equation 7 is calculated from the center position coordinate $X_2$ of the mark element MK2 and the center position coordinate $X_4$ of the mark element MK4:

$$X_3' = \frac{X_2 + X_4}{2} \quad (7)$$

Instead of a measured value of the center position coordinate $X_3$ of the mark element MK3, the center coordinate Xa is calculated from the center position coordinate $X_2$ of the mark element MK2 and the center position coordinate $X_4$ of the mark element MK4, which have predetermined accuracy. The erroneous center position coordinate $X_3$ is eliminated by using the center position coordinate $X_3'$. The center coordinate Xa is given by the following Equation 8:

$$Xa' = \frac{X_1 + X_2 + X_3' + X_4}{4} = \frac{2X_1 + 3X_2 + 3X_4}{8} \quad (8)$$

Figure 11:
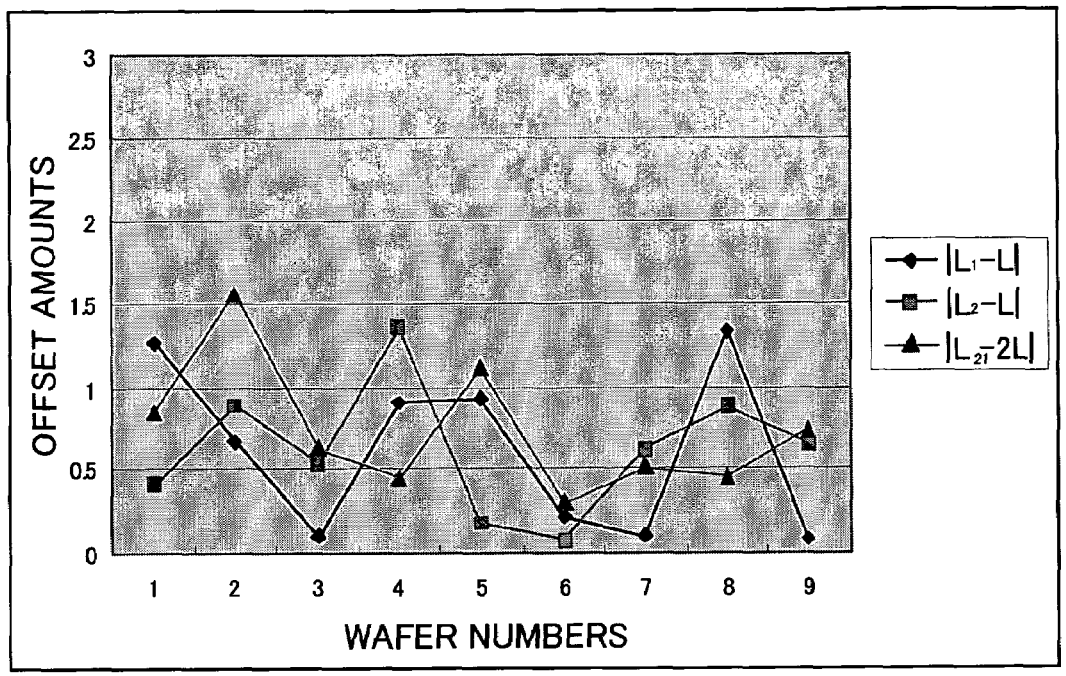
FIG. 11 is a graph that plots the result shown in FIG. 10 where the abscissa axis represents wafer numbers and the ordinate axis represents offset amounts or residuals between mark-interval measured values and designed reference values.

FIG. 10 is a view as a result of Equation 7 applying to residuals between the mark-interval measured values shown in FIG. 9 and designed reference values. FIG. 11 is a graph that plots a result shown in FIG. 10 where the abscissa axis represents wafer numbers and the ordinate axis represents offset amounts or residuals between mark-interval measured values and designed reference values. It is understood from FIGS. 10 and 11 that the mark interval improves with respect to the center position coordinate $X_3$ of the mark element MK3 in the wafer no. W6.

Similarly, when the center position coordinate $X_4$ of the mark element MK4 of the wafer no. W5 is abnormal, the center position coordinate $X_4'$ of the mark element MK4 is calculated from the center position coordinate $X_2$ of the mark element MK2 and the center position coordinate $X_3$ of the mark element MK3 using the following Equation 9:

$$X_4' = \frac{X_2 + X_3}{2} + 1.5L$$

Instead of the erroneous center position coordinate $X_4$ of the mark element MK4, the center position coordinate $X_4'$ is used to calculate the center coordinate Xa of the whole alignment mark. The center position coordinate $X_4'$ is calculated from the center position coordinate $X_2$ Of the mark element MK2 and the center position coordinate $X_3$ of the mark element MK3, which have predetermined accuracy. The erroneous center position coordinate $X_4$ is eliminated by using the center position coordinate $X_4'$, which is given by the following Equation 10:

$$Xa' = \frac{X_1 + X_2 + X_3 + X_4'}{4} = \frac{2X_1 + 3X_2 + 3X_3 + 3L}{8}$$

The center position coordinate $X_4'$ can be calculated using the following Equation 11, the center position coordinate $X_1$ of the mark element MK1, the center position coordinate $X_2$ of the mark element MK2, and an average of mark interval $L_2$:

$$X_4' = X_3 + \frac{L_1 + L_2}{2} = X_3 + \frac{X_2 - X_1}{2} + \frac{X_3 - X_2}{2} = \frac{3X_3 - X_1}{2} \quad (11)$$

The following Equation 12 expresses the center coordinate Xa of the whole alignment mark. Even in this case, the erroneous center position $X_4$ can be removed by substituting it for the erroneous center position coordinate $X_4'$:

$$Xa' = \frac{X_1 + X_2 + X_3 + X_4'}{4} = \frac{X_1 + 2X_2 + 5X_3}{8} \quad (12)$$

Figure 13:
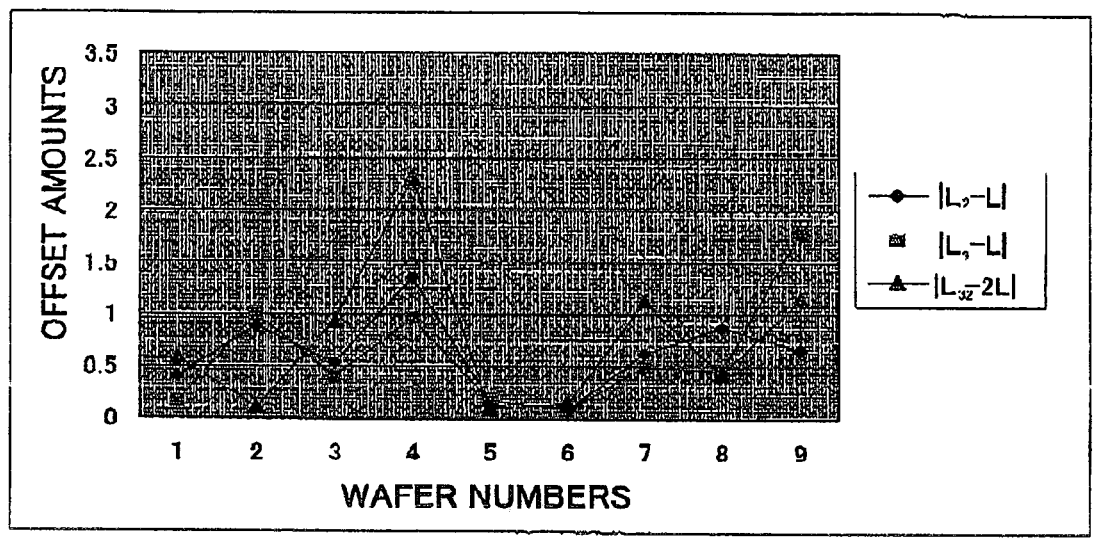
FIG. 13 is a graph that plots the result shown in FIG. 12 where the abscissa axis represents wafer numbers and the ordinate axis represents offset amounts or residuals between mark-interval measured values and designed reference values.

FIG. 12 is a view as a result of Equation 10 or 11 applying to residual values between the mark-interval measured values shown in FIG. 9 and designed reference values. FIG. 13 is a graph that plots a result shown in FIG. 12 where the abscissa axis represents wafer numbers and the ordinate axis represents offset amounts or residuals between mark-interval measured values and designed reference values. It is understood from FIGS. 12 and 13 that the mark interval improves with respect to the center position coordinate $X_4$ in the mark element MK4 in the wafer no. W5.

Thus, the accuracy deterioration due to signal processing is prevented by determining whether the mark element is abnormal in the alignment mark, and by selecting only the measured value having predetermined accuracy. Instead of using the measured value measured from the abnormal mark element, it is possible to use a value calculated from the measured value having the predetermined accuracy, which is measured from the other mark elements.

Figure 14:
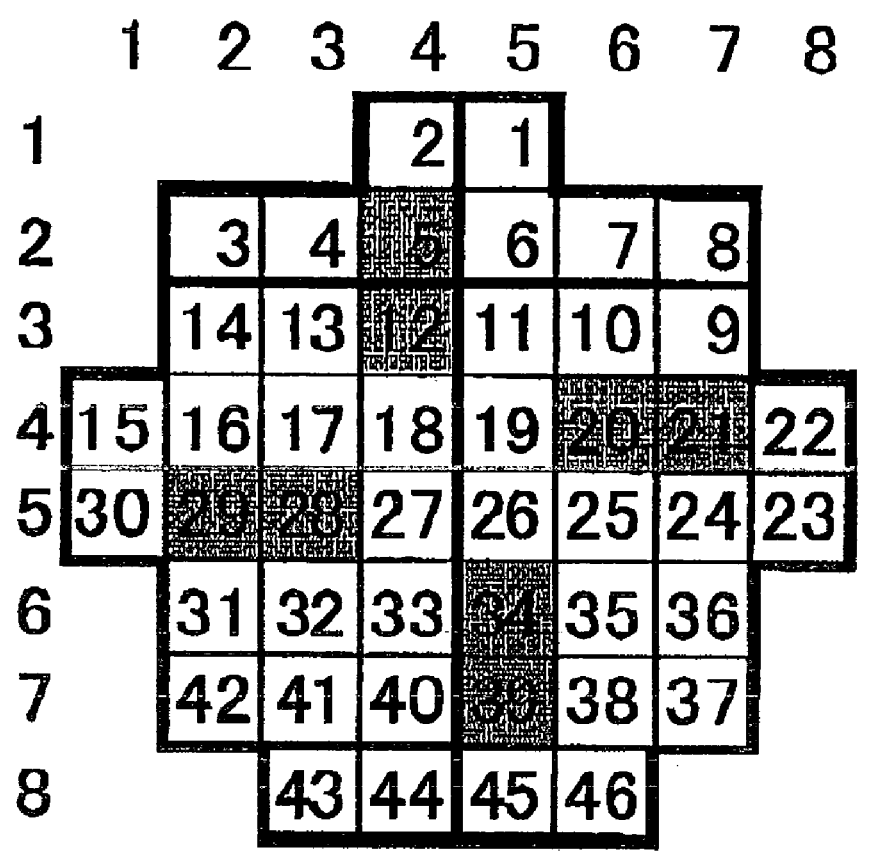

The alignment measurement is conducted for shots 5, 21, 29, and 39, for example, as shown in FIG. 14. For example, when the abnormality occurs in shot 29, the substitute shot 28 is used for the alignment measurement. Here, FIG. 14 is a schematic plane view showing a layout of shots subject to alignment measurements, where a figure indicates an exposure order.

It is determined whether the alignment measurement for the substitute shot is abnormal. When it is determined to be normal, the measured value is use. When it is determined to be abnormal, the alignment measurement is repeated. When the abnormality remains even after the predetermined number of alignment measurements (for example, three times), an alarm, etc. warns an operator. Otherwise, the measured value is used.

The alignment measurement accuracy may be checked in light of the entire alignment mark. Following the signal processing by the alignment signal processor 160 shown in FIG. 17, the mark intervals $L_1$ to $L_3$ are calculated using the center position coordinates $X_1$ to $X_4$ of the four mark elements shown in FIG. 21 and the following Equation 13 to 15:

$$L_1 = X_2 - X_1 \quad (13)$$

$$L_2 = X_3 - X_2 \quad (14)$$

$$L_3 = X_4 - X_3 \quad (15)$$

The mark intervals $L_1$ to $L_3$ become constant at the designed value of 20 μm as shown in FIGS. 19A, 19B, 20A and 20B when no detection error or WIS occurs. This makes it possible to check the measurement accuracy.

It is preferable that there is no deviation in the mark intervals $L_1$ to $L_3$ for the reference value $L=20$ μm, designed for the mark interval. However, a partially distortional alignment signal would enlarge one of residuals between the mark-interval measured values and designed reference values, i.e., $L_1-L$, $L_2-L$ and $L_3-L$.

An error amount including a measurement error of the whole alignment mark and an offset amount can be obtained by calculating the mean square error as a residual between the measured value of the mark interval and the designed reference value. The following Equation 16 provides the mean square error sq, where N is the number of mark intervals:

$$sq = \sqrt{\frac{(L_1 - L)^2 + (L_2 - L)^2 + (L_3 - L)^2}{N}} \quad (16)$$

It is understood from Equation 16 that as the number of mark intervals N increases, the accuracy increases by $N^{1/2}$.

Figure 16:
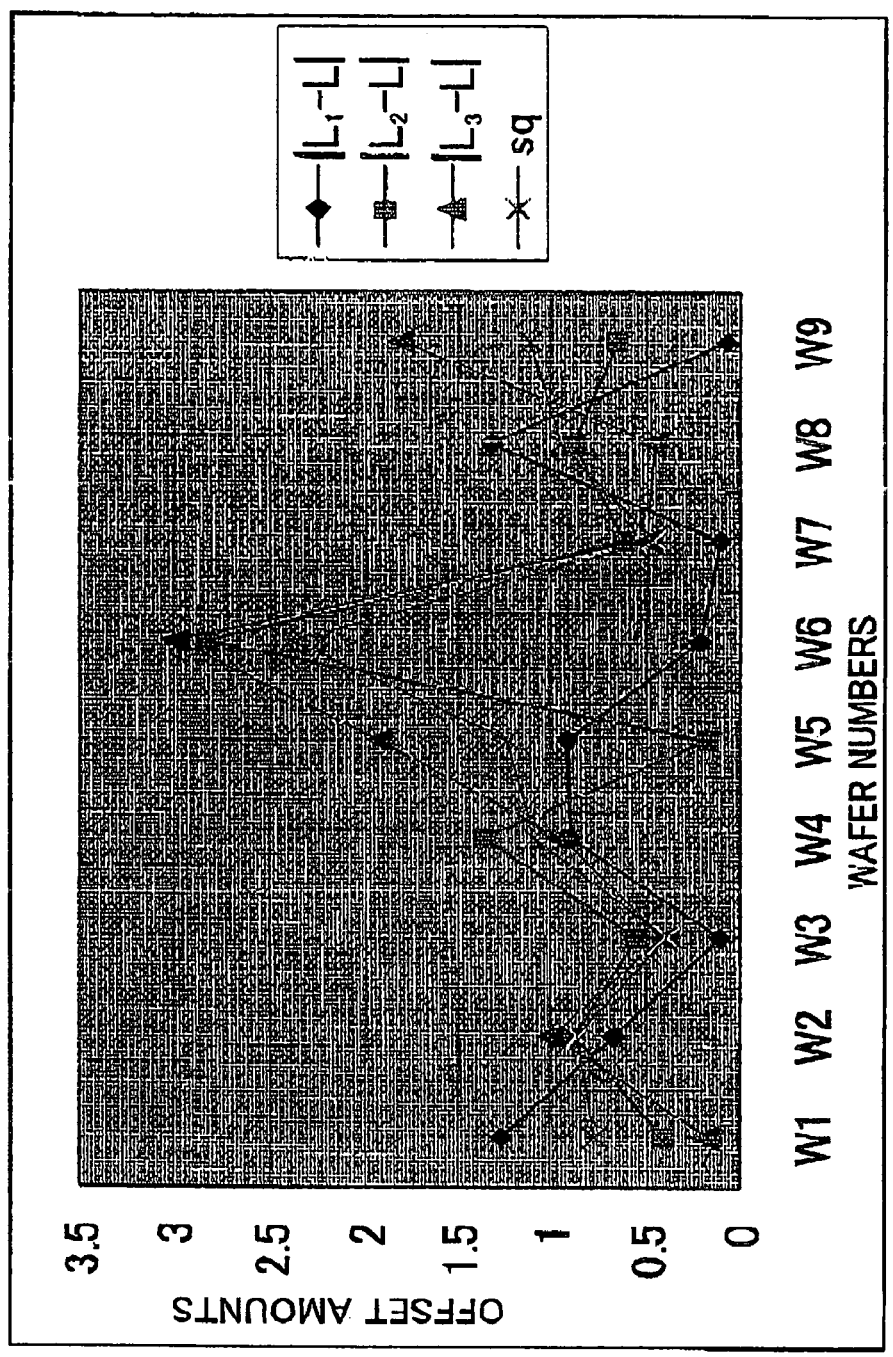
FIG. 16 is a graph that plots the result shown in FIG. 15 where the abscissa axis represents wafer numbers and the ordinate axis represents offset amounts or residuals between mark-interval measured values, designed reference values, and mean square errors.

FIG. 15 is a view of residuals between the mark-interval measured values in the alignment mark 180A shown in FIGS. 19A and 19B and designed reference values, and mean square error values. FIG. 16 is a graph that plots a result shown in FIG. 15 where the abscissa axis represents wafer numbers and the ordinate axis represents offset amounts or residuals between mark-interval measured values and designed reference values, and mean square errors.

It is understood from FIGS. 15 and 16 that the wafer no. W6 deviates greatly. The JOB setting that uses the following Equation 17 allows measured values greater than δp to be detected as an abnormal value, where δp is the JOB setting:

$$sq > \delta p \quad (17)$$

The instant embodiment sets a measured value equal to or greater than δp=1.5, and determines that the measured value of the wafer no. W6 is an abnormal value that exceeds the set range. When it is detected that the alignment mark exhibits an abnormal value, Equations 14 and 15 identify the abnormal mark element. A mark element that has been determined to be abnormal is not used, and a measured value from an adjacent mark element or a designed reference value is substituted so as to prevent accuracy deterioration.

The inventive position detecting method 1000 immediately determines the detection accuracy of the alignment mark, and removes the measured value that deteriorates the precision, preventing the deterioration of the entire accuracy and lowered throughput.

While a method that executes an offset correction based on the overlay inspection after exposure is available as in the prior art, the inventive method that can determine prior to exposure can immediately prevent the precision deterioration. When the offset correction value is not always the same, the conventional method cannot correct properly, whereas the present invention effects even in that case.

While a method for detecting an abnormality of the entire wafer for AGA shots has been conventionally conducted, the present invention characteristically determines a measurement result of each AGA shot and identifies the abnormal mark element in the alignment mark immediately. The inventive effects are not limited to the global alignment, like the AGA, but are applicable to the die-by-die system.

In exposure, light emitted from an illumination apparatus (not shown), for example, Koehler-illuminates the reticle 110. The light that has passed the reticle 110 and reflects the reticle pattern forms an image on the wafer 130 through the projection optical system 120. Since the position detecting method 1000 provides the exposure apparatus 100 with a highly precise alignment, the exposure apparatus 100 can provide excellent devices (such as semiconductor devices, LCD devices, image pick-up devices (such as CCDs), and thin film magnetic heads) with high throughput and economical efficiency.

Figure 28:
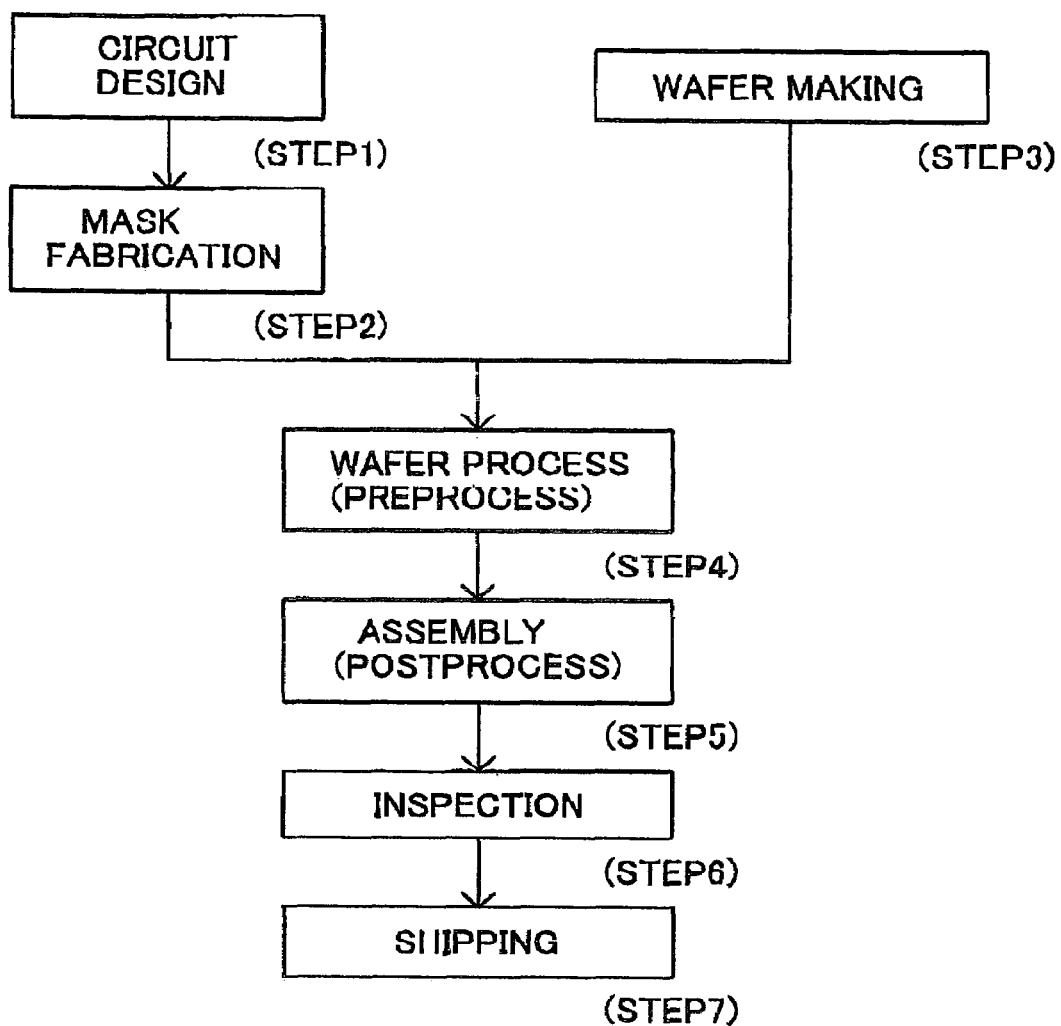
FIG. 28 is a flowchart for explaining a method for fabricating devices (semiconductor chips such as ICs, LSIs, and the like, LCDs, CCDs, etc.).
Figure 29:
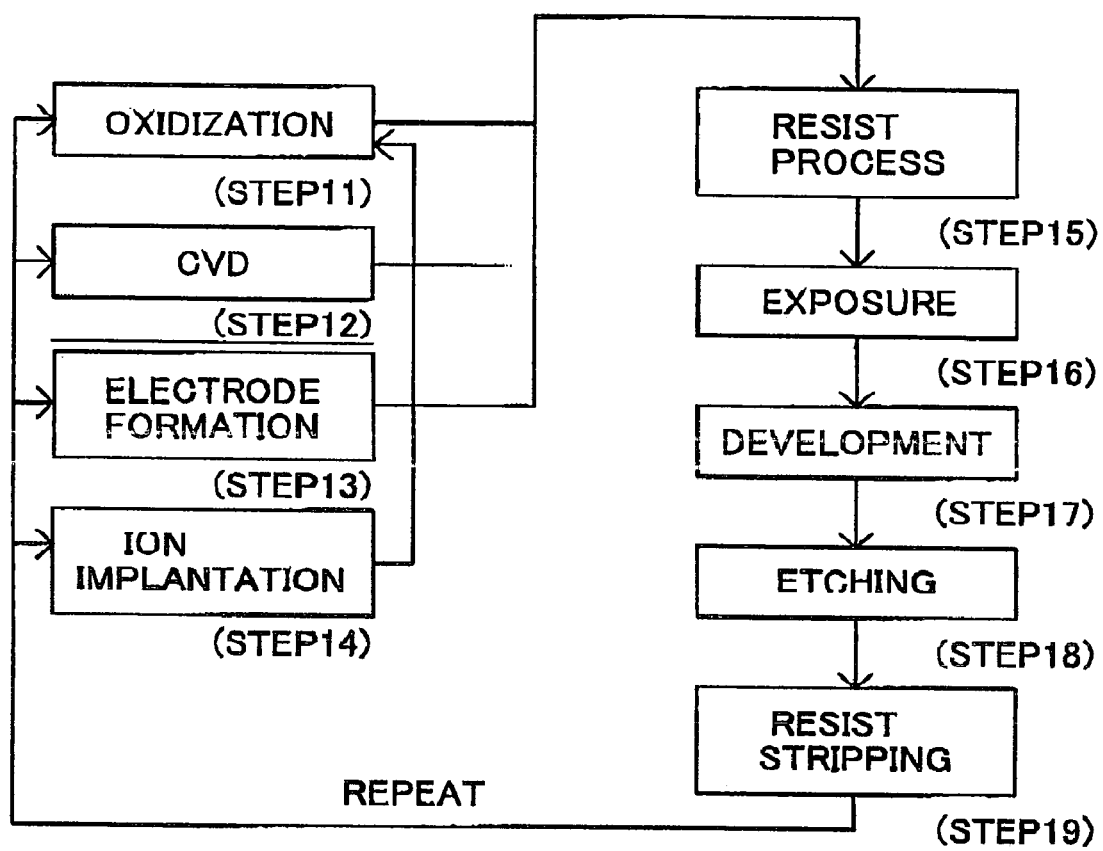
FIG. 29 is a detailed flowchart for Step 4 of wafer process shown in FIG. 28.

Referring now to FIGS. 28 and 29, a description will be given of an embodiment of a device fabricating method using the above exposure apparatus 100. FIG. 28 is a flowchart for explaining the fabrication of devices (i.e., semiconductor chips such as IC and LSI, LCDs, CCDs, etc.). Here, a description will be given of the fabrication of a semiconductor chip as an example. Step 1 (circuit design) designs a semiconductor device circuit. Step 2 (mask fabrication) forms a mask having a designed circuit pattern. Step 3 (wafer preparation) manufactures a wafer using materials such as silicon. Step 4 (wafer process), which is referred to as a pretreatment, forms actual circuitry on the wafer through photolithography using the mask and wafer. Step 5 (assembly), which is also referred to as a posttreatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 29 is a detailed flowchart of the wafer process in Step 4. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ions into the wafer. Step 15 (resist process) applies a photosensitive material onto the wafer. Step 16 (exposure) uses the exposure apparatus 100 to expose the circuit pattern on the mask onto the wafer. Step 17 (development) develops the exposed wafer. Step 18 (etching) etches parts other than the developed resist image. Step 19 (resist stripping) removes disused resist after etching. These steps are repeated, and multilayer circuit patterns are formed on the wafer. The device fabrication method of this embodiment may manufacture higher quality devices than the conventional one. Thus, the device fabrication method using the exposure apparatus 100 and the resultant devices constitute one aspect of the present invention.

Further, the present invention is not limited to these preferred embodiments, and various variations and modifications may be made without departing from the scope of the present invention. For example, the present invention is applicable to an alignment of a reticle in addition to the alignment of the wafer.

Thus, the present invention can provide a position detecting method that reconciles the necessary alignment accuracy and the throughput even when detection results of alignment marks scatter.

What is claimed is:

1. A position detecting method for detecting a position of an object, on which an alignment mark including plural mark elements is formed, said method comprising the steps of:
    detecting positions of the plural mark elements and obtaining a predetermined mark element interval between the plural mark elements;
    calculating an offset between the predetermined mark element interval obtained by said obtaining step and an interval reference value of the predetermined mark elements which is calculated by a designed value of the alignment mark corresponding to the predetermined mark element interval;
    determining abnormality of the mark elements based on the offset;
    producing a position of the mark element determined to be abnormal by the determining step, from a position of the mark element that is determined normal; and
    calculating the position of the alignment mark using the position of the mark element that is determined normal by the determining step and the position of the mark element that is produced by the producing step.

2. A position detecting method according to claim 1, wherein said determining step determines abnormality in the three mark elements based on a combination of the mark intervals in adjacent three mark elements in the alignment mark.

3. A position detecting method according to claim 1, further comprising the step of repetitively detecting the positions of the mark elements which have been determined to be abnormal by the determining step.

4. A position detecting method according to claim 1, wherein said determining step includes the steps of:
    calculating a mean square error of the offset; and
    determining whether each of the plural mark elements is normal or abnormal based on the mean square error calculated by said calculating step.

5. A position detecting apparatus for detecting an object, on which an alignment mark including plural mark elements is formed, said position detecting apparatus comprising:
    a detector for detecting positions of the mark elements; and
    a processor for providing a position detecting method according to claim 1.

6. An exposure apparatus that exposes a predetermined pattern through a projection optical system, said exposure apparatus comprising:
    a position detecting apparatus according to claim 5; and
    an alignment unit for an alignment of an object to detected using a detection result by said position detector.

7. An exposure apparatus according to claim 6, wherein the object is a wafer onto which the predetermined pattern is exposed.

8. An exposure apparatus according to claim 6, wherein the object is a reticle on which the predetermined pattern is formed.

9. A device fabrication method comprising the steps of:
    exposing an object using an exposure apparatus according to claim 6; and developing the object that has been exposed.

10. An exposure method comprising the steps of:
    aligning a predetermined area on an object using a position detecting method according to claim 1; and
    exposing the predetermined area on the object that is aligned by said aligning step.

* * * * *